(12) United States Patent
Kellogg et al.

(10) Patent No.: US 7,948,153 B1
(45) Date of Patent: May 24, 2011

(54) PIEZOELECTRIC ENERGY HARVESTER HAVING PLANFORM-TAPERED INTERDIGITATED BEAMS

(75) Inventors: Rick A. Kellogg, Tijeras, NM (US); Hartono Sumali, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 259 days.

(21) Appl. No.: 12/325,311

(22) Filed: Dec. 1, 2008

Related U.S. Application Data

(60) Provisional application No. 61/053,044, filed on May 14, 2008.

(51) Int. Cl.
*H01L 41/113* (2006.01)
(52) U.S. Cl. .......... 310/339; 310/329
(58) Field of Classification Search .......... 310/329–332, 310/339
See application file for complete search history.

(56) References Cited

U.S. PATENT DOCUMENTS

| | | | |
|---|---|---|---|
| 5,814,921 A * | 9/1998 | Carroll | 310/339 |
| 7,005,777 B2 | 2/2006 | Wright et al. | |
| 7,105,982 B1 | 9/2006 | Hagood, IV et al. | |
| 7,414,351 B2 | 8/2008 | Ulm et al. | |
| 7,521,841 B2 * | 4/2009 | Clingman et al. | 310/339 |
| 2006/0086498 A1 | 4/2006 | Wetzel et al. | |
| 2006/0217776 A1 | 9/2006 | White et al. | |
| 2007/0145861 A1 * | 6/2007 | Tanner | 310/339 |
| 2007/0188053 A1 * | 8/2007 | Stark | 310/339 |
| 2007/0252479 A1 * | 11/2007 | Ishikawa | 310/339 |
| 2007/0284969 A1 * | 12/2007 | Xu | 310/339 |

OTHER PUBLICATIONS

Anton, S.R. et al., "A review of power harvesting using piezoelectric materials (2003-2006)", Smart Mater.Struct. vol. 16, 2007, pp. R1-R21.
AdaptivEnergy Llc, website publication "Energy Harvesting Technology" downloaded from the world wide web at http://www.adaptivenergy.com/energy_harv/docs/AdaptivEnergy_Energy%20Harvesting_Technology_Rev-1.pdf, material downloaded on Jan. 22, 2008.
Arms, S.W. et al.,"Power Management for Energy Harvesting Wireless Sensors", Proceedings of SPIE Int'l Symp. on Smart Structures and Smart Materials, Mar. 9, 2005, San Diego, CA, USA.

* cited by examiner

*Primary Examiner* — Derek J Rosenau
(74) *Attorney, Agent, or Firm* — Olivia J. Tsai

(57) ABSTRACT

Embodiments of energy harvesters have a plurality of piezoelectric planform-tapered, interdigitated cantilevered beams anchored to a common frame. The plurality of beams can be arranged as two or more sets of beams with each set sharing a common sense mass affixed to their free ends. Each set thus defined being capable of motion independent of any other set of beams. Each beam can comprise a unimorph or bimorph piezoelectric configuration bonded to a conductive or non-conductive supporting layer and provided with electrical contacts to the active piezoelectric elements for collecting strain induced charge (i.e. energy). The beams are planform tapered along the entirety or a portion of their length thereby increasing the effective stress level and power output of each piezoelectric element, and are interdigitated by sets to increase the power output per unit volume of a harvester thus produced.

23 Claims, 8 Drawing Sheets

PIEZOELECTRIC ENERGY HARVESTER HAVING PLANFORM-TAPERED INTERDIGITATED BEAMS

RELATED APPLICATIONS

This application claims the benefit of U.S. Provisional Application No. 61/053,044 filed on May 14, 2008, the entirety of which is herein incorporated by reference.

STATEMENT REGARDING FEDERALLY SPONSORED RESEARCH OR DEVELOPMENT

The United States Government has certain rights in this invention pursuant to Department of Energy Contract No. DE-AC04-94AL85000 with Sandia Corporation.

FIELD OF THE INVENTION

The invention generally relates to energy harvesters that can operate to convert mechanical energy in the form of vibrations into electrical energy. Embodiments of the invention include velocity damped resonant generators (i.e. VDRGs) having a plurality of interdigitated, planform-tapered, piezoelectric elements.

BACKGROUND OF THE INVENTION

As wireless computing and distributed sensor networks become more mature and widespread, a remaining issue for the technology deployment becomes the power source. Conventionally, a wireless, portable sensor or microprocessor is powered by a battery. Though battery technologies have improved, energy densities and lifetimes are still issues for many systems. A battery holds a finite amount of energy and when that energy has been consumed by its load, the battery must be recharged. For many remote systems, recharging a battery is not an option. If a system is required to remain idle for months or years and then spring to life at a certain moment, a battery may have already become depleted due to leakage or self-discharge.

Embodiments of the present invention provide power to (inter alia) small remote systems through the conversion of ambient environmental accelerations, i.e. vibrations, into electrical energy. Two vibration classes of interest are sinusoid and random, either or both of which may predominate in a given vibration environment. The basis for vibration-based energy harvesting in this work is velocity damped resonant generation (VDRG), where environmental accelerations are harnessed to drive a cantilevered mass into oscillation and energy is then extracted from the mass motion through damping forces. The damping forces can be created by the piezoelectric transduction mechanism that converts mechanical to electrical power. The piezoelectric effect provides high power density and simplicity in implementation across the micrometer to centimeter size-scales.

A number of different piezoelectric energy harvesting approaches have been described. See for example, Anton et al., "A review of power harvesting using piezoelectric materials (2003-2006)", Smart Mater. Struct. 16 (2007) R1-R21, which provides an overview of work conducted in vibration harvesting, mechanics, efficiency, power storage and circuitry.

Despite the breadth of research into vibration energy harvesting, with a number of ad hoc designs being generated over sizes scales ranging from the micro to macro, issues remain which must be addressed before it can be effectively implemented in real-world applications including the need to maximize harvester power output performance with respect to volume. The present invention provides a solution to these problems in the form of novel energy harvesting devices comprising a plurality of planform-tapered piezoelectric beams that allow maximal power density for virtually any harmonic or random vibration environment. Applications where piezoelectric energy harvesting can be desired include; air, water and land-based vehicles, oil rigs, heavy machinery, bridges and other architectural structures subjected to vibrations. The terms "vibrational energy converter", "vibrational energy harvester", "energy harvester", and "mechanical vibration to electrical energy converter" are interchangeable in the context of this specification.

BRIEF DESCRIPTION OF THE DRAWINGS

The accompanying drawings, which are incorporated in and form part of the specification, illustrate several embodiments of the present invention and, together with the description, serve to explain the principles of the invention. The drawings provided herein are not drawn to scale.

DETAILED DESCRIPTION OF THE INVENTION

Figure 1A:
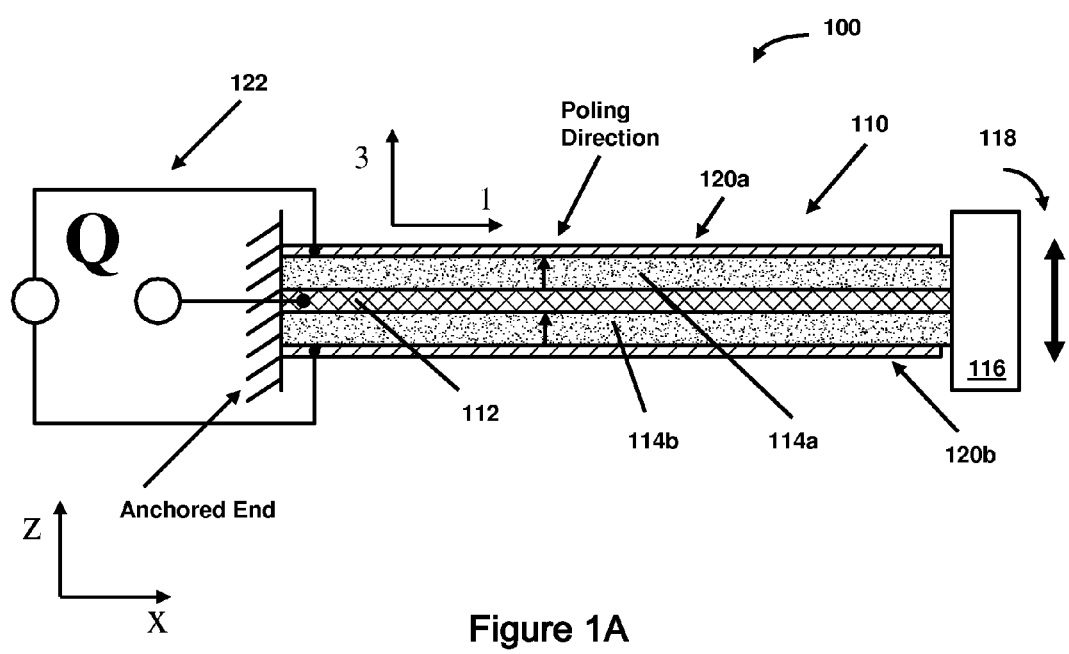
FIG. 1A is a schematic cross-sectional diagram of a piezoelectric bimorph cantilever beam energy harvester.

FIG. 1A is a schematic cross-sectional diagram of a piezoelectric bimorph cantilever beam energy harvester. The energy harvester 100 comprises a cantilevered beam 110 anchored at one end (e.g. a fixed end). The beam 110 can be made of a three-layer (or more) stack up including a conductive shim 112 (e.g. support layer) sandwiched between two layers of piezoelectric material 114(a,b). The present invention anticipates that there could be many layers of piezoelectric materials, support layers and electrodes in the stack up of a beam 110. The beam 110 is referred to as a bimorph as it comprises two "active" piezoelectric layers 114(a,b) disposed on opposing sides of the central support layer 112. Piezoelectric layers 114(a,b) can be bonded by adhesive layers (not shown) to the conductive shim 112. The cantilevered beam 110 forms a relatively soft spring element that supports an end (e.g. sense) mass 116 at the un-anchored (i.e. free) end of the beam 110. As inertial forces on the mass 116 and beam induce a beam tip deflection 118 (e.g. up/down) the piezoelectric elements 114(a,b) undergo compressive or tensile stress in the "1" direction depending on the sense of the deflection (e.g. bimorph). With the piezoelectric materials poled parallel (or anti-parallel) to the "3" direction, and conductive electrodes 120(a,b) on the top and bottom surfaces of each piezo element 114(a,b) the illustrated device is by convention, referred to as operating in mode $d_{31}$. The circuit 122 indicated at the left end of the diagram represents a parallel electrical configuration where charge, Q, is collected from top and bottom piezo elements 114(a,b) at the same potential while the central conductive shim 112 acts as a common, thereby extracting useful energy from the system upon movement of the end mass 116. This mechanism is the basis for embodiments of vibrational energy harvesters according to the present invention. The central shim serves a dual function where its thickness also provides a standoff for the interior face of the each piezo element from the neutral axis of cantilever bimorph. This standoff serves to bias the stress for each piezoelectric element as well as to increase the stress level in each piezoelectric material thereby increasing the electrical output for a given amount of tip deflection. For the two piezoelectric layers 114(a,b) to operate in parallel, the poling direction of the piezo elements can be parallel (e.g. aligned) to one another. If operation in low-vibration environments is desired, where beam tip deflections can be expected to be small, the piezo beam elements can be poled anti-parallel to one another and connected in series to double the output voltage. It should be noted that the terms piezoelectric element and transduction element are used interchangeably in the context of the present disclosure.

The composite, bimorph cantilever beam 110 can be machined from commercially available composite plate, such as available from Morgan Electro Ceramics, Fairfield N.J., USA. Typical bimorph composite plates comprise for example, Lead Zirconate Titanate (PZT) piezoelectric layers 114(a,b) (or any of the many piezoelectric materials available) adhesively bonded (e.g. using electrically conductive adhesives or diffusion bonding) to electrically conductive shim 112 (e.g. central supporting layer) materials that include brass and/or materials with a high mechanical quality factor. Outer electrode layers 120(a,b) include nickel (e.g. vacuum deposited) and silver (e.g. fired paste) metallizations (other conductive materials can be used as well). A composite plate comprising one or more layers of piezoelectric materials, support layers and/or electrode layers is referred to as a "transducer sheet".

Figure 1B:
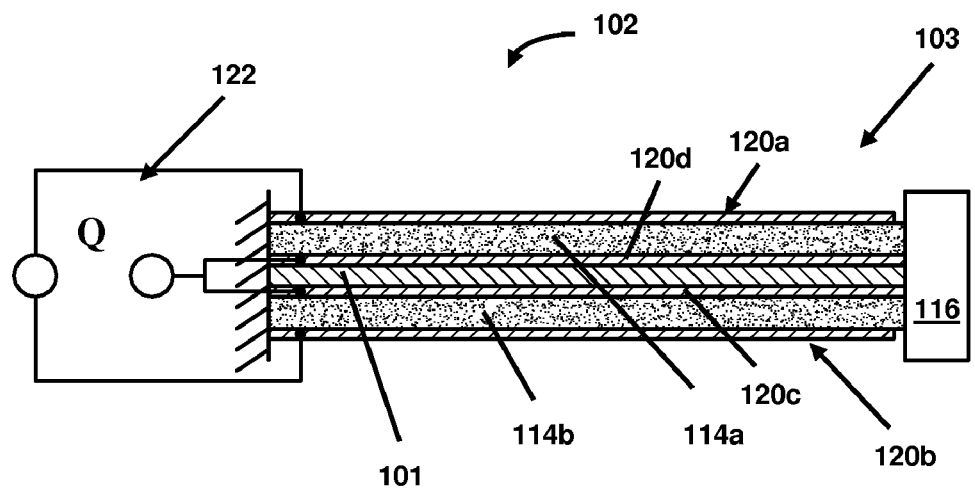
FIG. 1B is a schematic cross-sectional diagram of another embodiment of a piezoelectric bimorph cantilever beam energy harvester.

FIG. 1B is a schematic cross-sectional diagram of another embodiment of a piezoelectric bimorph cantilever beam energy harvester 102. In this embodiment the cantilever beam 103 includes a central support 101 (e.g. shim) which comprises a non-conductive material such as a polymer, ceramic and/or glass. Piezoelectric elements 114(a,b) can be bonded to the support 101 by means of a conductive adhesive that can further serve to form electrodes 120(c,d) for electrical connection to the piezoelectric elements. The piezoelectric elements can have electrodes on both surfaces which can comprise the support itself, conductive adhesives and/or metallic layers on those surfaces. The function of the energy harvester is as otherwise described above.

Figure 1C:
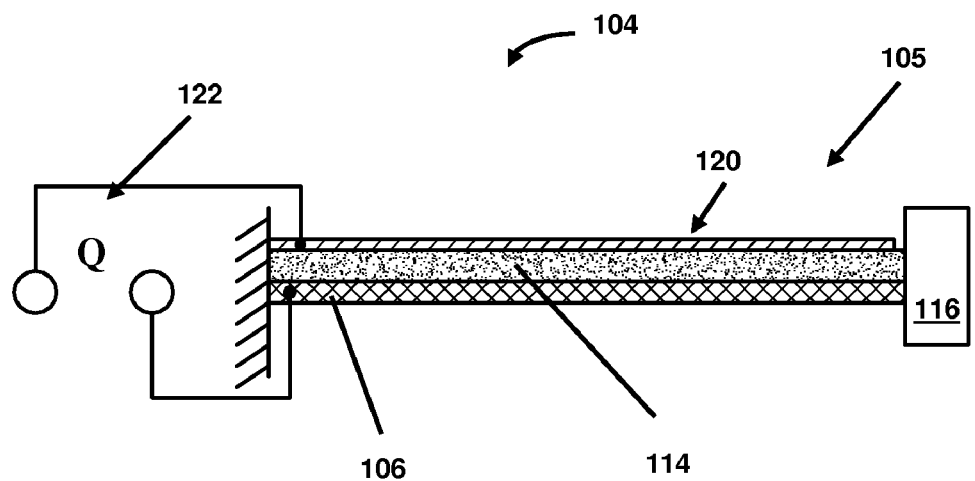
FIG. 1C is a schematic cross-sectional diagram of an embodiment of a piezoelectric unimorph cantilever beam energy harvester.

FIG. 1C is a schematic cross-sectional diagram of an embodiment of a piezoelectric unimorph cantilever beam energy harvester 104. In this alternative embodiment beam 105 can comprise a single layer of active material; piezoelectric element 114 bonded to a support 106 that can comprise conductive or non-conductive material as described above. This embodiment is referred to as a unimorph as there is only one layer of active material. The structural neutral axis is not coincident with the mid-plane of the piezoelectric material. Charge Q and therefore energy can be extracted by means of an electrical circuit 122 upon movement of end mass 116 due to vibrations. For convenience the examples presented below are directed to bimorph cantilever beams having a central conductive support. Embodiments of the invention can as well comprise non-conductive central supports and unimorph cantilever beams.

Figure 2:
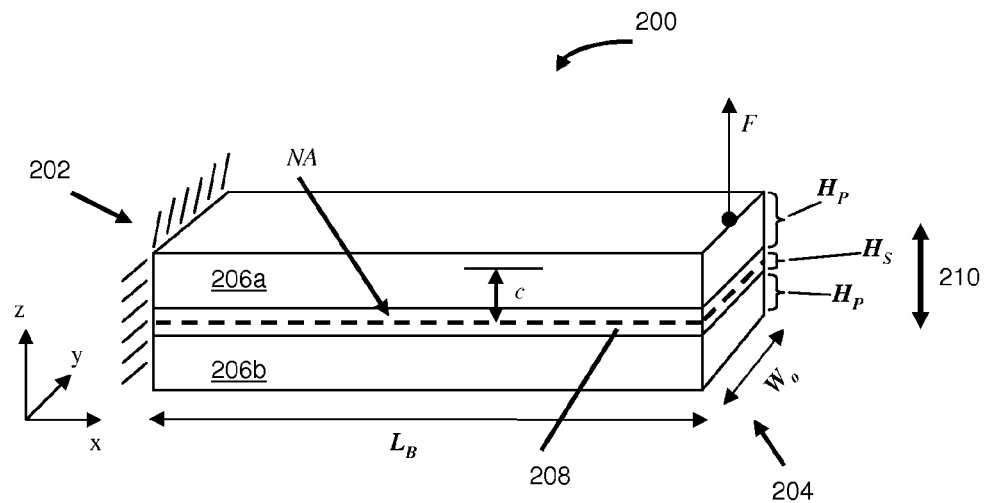
FIG. 2 is a schematic block diagram of a planform-rectangular piezoelectric bimorph cantilever beam.

FIG. 2 is a schematic block diagram of a planform-rectangular piezoelectric bimorph cantilever beam. The planform-rectangular beam 200 can be parameterized as a composite cantilever beam having a flexural length, $L_B$, from the anchor 202 to its free end 204, with constant width, $W_o$, where piezoelectric 206(a,b) and shim 208 layers have thicknesses $H_p$ and $H_s$ respectively. The piezoelectric material's surface electrodes (not shown, e.g 120(a,b) above) are very thin and considered mechanically negligible. In an x-y-z coordinate system, the beam 200 is anchored at the origin with its length lying parallel to the x axis and with the tip deflection 210 along the z direction. By symmetry, the neutral axis of the beam, NA, corresponds to the mid-thickness of the shim material. The shim 208 and piezoelectric materials 206(a,b) have a Young's modulus of $E_s$ and $E_p$ respectively.

For simplicity, the stress developed in the planform-rectangular piezoelectric element due to a static load, is considered for subsequent comparison to that developed in a planform-tapered beam configuration described below.

For a tip deflection produced in the z direction, due to a force F and acting at $x=L_B$, assuming a clockwise positive sense, the moment as a function of x is $$M(x)=F(L_B-x). \quad \text{(Eqn. 1)}$$

In the use of simple bending theory for a composite beam having differing material layers through its thickness, the different values of Young's modulus may be compensated for in terms a representative material by mathematically adjusting each material layer's width. If the piezoelectric material's modulus is chosen as the reference, and using the relation for the second moment of area ($I=WH^3/12$), then second moment of area for the composite beam of constant width $W_o$ is $$I_o = \frac{W_o}{12}\left[2H_p^3 + 6H_p(H_s + H_p)^2 + \frac{E_s}{E_p}H_s^3\right]. \quad \text{(Eqn. 2)}$$

The fiber stress as a function of distance x along the beam length and for distance c from the neutral axis is $$\sigma_{fib}(x, c) = \frac{M(x)c}{I_o}, \quad \text{(Eqn. 3)}$$

which by inspection can be seen to be at its maximum at the beam root and at the outer surface of the beam (i.e. when x=0 and c=($H_s/2+H_p$). The maximum fiber stress, $\sigma_{fibmaxrect}$, for the planform-rectangular beam is then $$\sigma_{fib\,max\,rect} = \frac{FL_B\left(\frac{H_s}{2} + H_p\right)}{I_o}. \quad \text{(Eqn. 4)}$$

This maximum fiber stress in the piezoelectric element can become a limiting factor for the allowable tip load and deflection since the piezoelectric material must not be overstressed to avoid depoling, and at higher load levels, fatigue or even structural failure. The average stress developed throughout the volume of the piezoelectric element (assuming linear superposition) will directly control the voltage and power output of the transduction element. Consequently, it is desired to maximize the piezoelectric element's average stress while minimizing its maximum fiber stress (Eqn. 4) to realize the best performance possible. The average-to-maximum stress ratio will provide a metric for the efficacy of a transduction element's design. The volumetric averaging of the piezoelectric stress due to force F yields $$\sigma_{fib\,ave\,rect} = \frac{1}{W_o L_B H_p} \int_0^{L_B} \int_{H_s/2}^{(H_s/2+H_p)} \sigma_{fib}(xx) W_o dz dx = \frac{F L_B (H_s + H_p)}{4 I_o}, \quad \text{(Eqn. 5)}$$

and the resulting average-to-maximum stress ratio (Eqn. 4 divided by Eqn. 5), where $H_s$ is assumed to equal $H_p$, becomes $$\frac{\sigma_{fib\,ave\,rect}}{\sigma_{fib\,max\,rect}} = \frac{1}{3}. \quad \text{(Eqn. 6)}$$

It is well known that as electrical power is a function of voltage squared (e.g. $P=V^2/R$, where P is power, V voltage and R resistance) that the power output of a piezoelectric bimorph transducer is a function of stress squared, so it can be seen that the deflected planform-rectangular transduction element only captures $(\frac{1}{3})^2$ or ~11% of the theoretical power output limit.

The linear dependence of bending moment along the rectangular beam's length, in Eqn. 1, and the linear stress' dependence on bending moment and distance from the neutral axis in Eqn. 3, indicate two potential approaches to improve the output performance of a bimorph cantilever beam. One possibility is to vary the thickness of the piezoelectric composite laminate in the direction of bending, as a function of x to compensate for the changing moment; this would require that the beam becomes thinner in proportion to the cube root of the distance from the beam root. Using this approach, however, is anticipated to be costly and difficult to manufacture.

Figure 3:
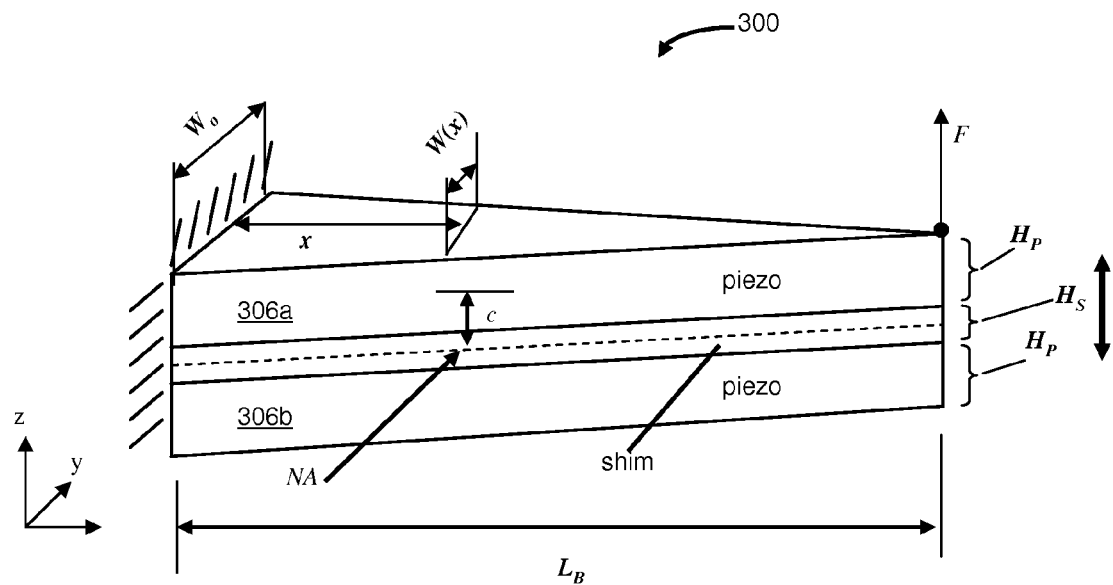
FIG. 3 is a schematic block diagram of an embodiment of a planform-tapered piezoelectric bimorph cantilever beam.

FIG. 3 is a schematic block diagram of a planform-tapered piezoelectric bimorph cantilever beam. An alternative approach as incorporated by embodiments of the present invention is to use a linearly planform-tapered beam 300 of a shim sandwiched by layers of piezoelectric material 306a, 306b where a decreasing beam width (e.g. planform-tapered) offsets the decreasing bending moment with increasing distance from the root. The idealized planform-tapered beam has an initial width, $W_o$, at the root and tapers to a point at $x=L_b$.

For the idealized example the tapered beam width, $W(x)$, as a function of distance from the root is $$W(x) = W_o \left(1 - \frac{x}{L_B}\right), \quad \text{(Eqn. 7)}$$

and the corresponding second moment becomes $$I(x) = I_o \left(1 - \frac{x}{L_B}\right), \quad \text{(Eqn. 8)}$$

where $I_o$ is the same as that defined for the rectangular beam by Eqn. 2. Using Eqn. 3 to calculate the fiber stress for the tapered beam subjected to load F reveals that the stress is constant with respect to x as given by $$\sigma_{fib\,tapred}(x, c) = \frac{F L_B c}{I_o}, \quad \text{(Eqn. 9)}$$

and then the maximum fiber stress, which occurs at the beam's outer surface, is $$\sigma_{fib\,max\,tapred} = \frac{F L_B \left(\frac{H_s}{2} + H_p\right)}{I_o}. \quad \text{(Eqn. 10)}$$

Since the average fiber stress for the piezoelectric material occurs at $c=(H_s+H_p)/2$ and the stress is invariant with x, then using Eqn. 9 the volume averaged stress is given by $$\sigma_{fib\,ave\,tapred} = \frac{F L_B (H_s + H_p)}{2 I_o}. \quad \text{(Eqn. 11)}$$

The average-to-maximum stress ratio for the planform-tapered beam (Eqn. 11 divided by Eqn. 10), where $H_s$ is assumed to equal $H_p$, is then $$\frac{\sigma_{fib\,ave\,tapred}}{\sigma_{fib\,max\,tapred}} = \frac{2}{3}. \quad \text{(Eqn. 12)}$$

Again, since the power output of the bimorph piezoelectric transducer is a function of stress squared we find that the bending planform-tapered transduction element can capture $(\frac{2}{3})^2$ or ~44% of the theoretical limit. Significantly, a planform-tapered beam can output two times as much voltage and four times as much power as the planform-rectangular beam, on a per volume basis for a given static force, while operating at the identical maximum stress limit (i.e. Eqn. 4=Eqn. 10). Although this analysis is based on static deflections, it is expected that the planform-tapered beam configuration can provide a significant advantage over planform-rectangular designs for a common base excitation and operating frequency (i.e. under dynamic conditions).

Figure 4A:
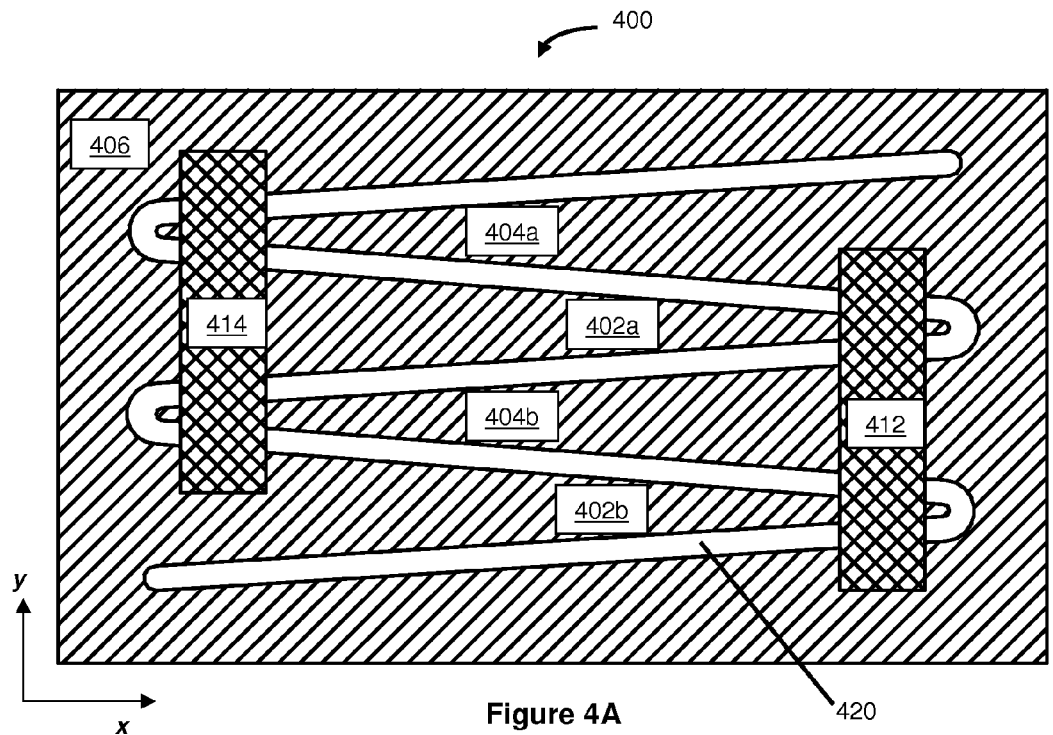
FIG. 4A is a schematic block diagram of an embodiment of a planform-tapered interdigitated beam energy harvester according to the present invention.

FIG. 4A is a schematic block diagram of an embodiment of a planform-tapered interdigitated beam energy harvester according to the present invention. To take the greatest advantage of the planform-tapered beam concept from a power density perspective, multiple planform-tapered beams 402(a, b) and 404(a,b) can be interdigitated together side by side and head to toe (e.g. nested) to form an energy harvester 400. The tapered beams illustrated here consist of isosceles triangles wherein beams 402(a,b) are anchored to a frame 406 near the left side of the figure, and joined at or near their tips by a common end mass 412. With vibration inputs to the frame (acting as the base in a VDRG), the beam set 402(a,b) and attached end mass 412 oscillates in the z direction (into/out of the page). The planform-tapered beam set 404(a,b) and corresponding end mass 414 can be arranged as mirror-image of beams 402(*a,b*) and operate in a similar fashion, but independently of the 402(*a,b*) beam set. The end masses 412 and 414 are designed with a standoff (e.g. clearance) in the z direction to accommodate their respective motions without interference with the other beam set(s). Beams 404(*a,b*) are said to be interdigitated with beams 402(*a,b*), e.g. as in inter-meshing the teeth (e.g. beams) of comb-like structures.

The beams comprising each beam set respond to vibration inputs in phase at their fundamental resonance frequency and may be wired electrically in parallel or series as needed. Coupling two or more beams together, through an end mass, confers an additional advantage wherein undesirable torsional and side-to-side, resonant-mode vibrational shapes are pushed to higher frequencies by selective stiffening of the structure. For example, a single tapered beam would act as a cantilever beam in the y-direction with a modest second-moment of area. However by connecting it rigidly via the end mass to another beam the two beams together tend to behave as a fixed-guided system (provided the beams are narrow in the y-direction at the juncture with the mass) with a significantly higher resonant frequency. Additionally, the joined beams also exhibit a much higher second-moment of area (proportional to beam spacing cubed) and deflect as a cantilever beam with yet an even higher resonant frequency.

The fabrication of an energy harvester comprising interdigitated, planform-tapered beams and a frame is straight forward, where a single sheet of a composite-piezoelectric stack material can be machined with one zigzag shaped continuous cut 420 (e.g. by laser machining or abrasive water jet) as indicated in FIG. 4A. To increase anchor rigidity the composite material sheet comprising the frame may be clamped between additional structures such as a package top and bottom. Fabrication details of an exemplary prototype, interdigitated, planform-tapered vibration energy harvester are discussed below. While only two beam sets are illustrated, any number beam sets can be employed.

Figure 4B:
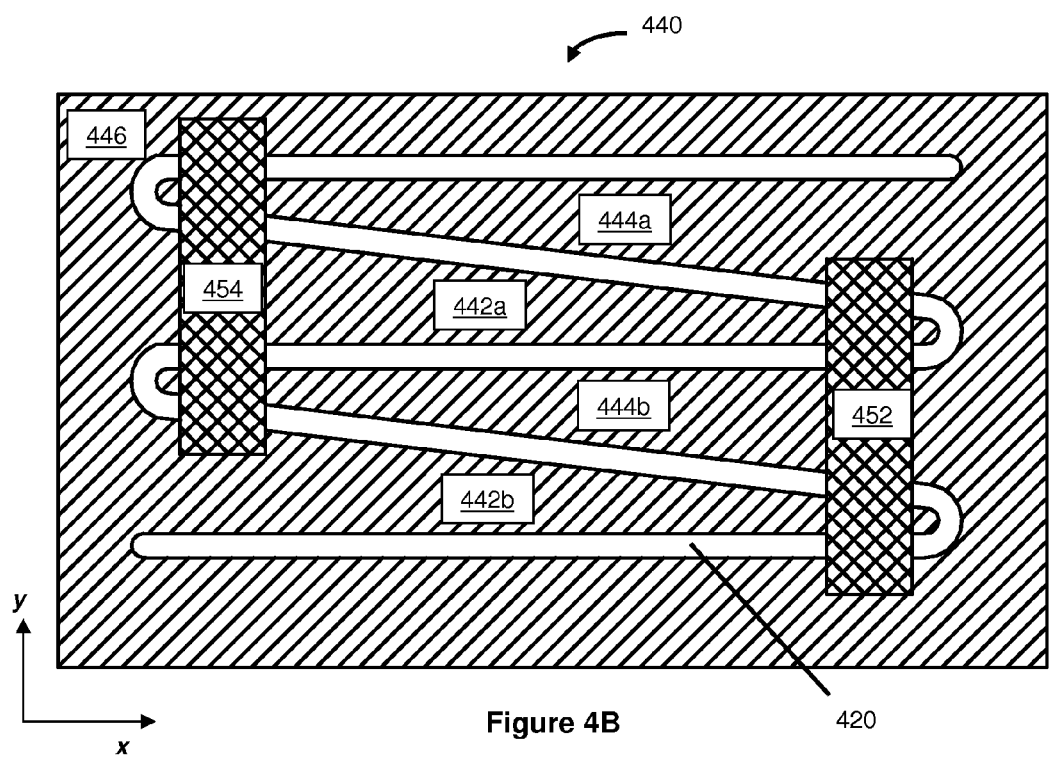
FIG. 4B is a schematic block diagram of another embodiment of a planform-tapered interdigitated beam energy harvester according to the present invention.

FIG. 4B is a schematic block diagram of another embodiment of a planform-tapered interdigitated beam energy harvester according to the present invention. In this embodiment the energy harvester 440 comprises two sets of interdigitated planform-tapered beam sets 442(*a,b*) and 444(*a,b*) anchored to a frame 446 wherein each beam comprises a right triangle, providing a somewhat more space efficient design in comparison to the energy harvester of FIG. 4A, comprising isosceles triangle shaped beams. End masses 452 and 454 are fixed to the free end of beam sets 442(*a,b*) and 444(*a,b*) respectively. The exact shape of the planform-taper is not critical to the practice of the invention and can be linear along the entirety of the length of the beam (as illustrated) or as well can comprise a curved line. As described further below, it is only necessary that a portion of the beam length comprise a planform-taper to take advantage of the invention. Furthermore in the practice of the invention, a planform-taper can comprise a plurality of steps, as for example, may be cut with a tool having an x-y stage.

Figure 5:
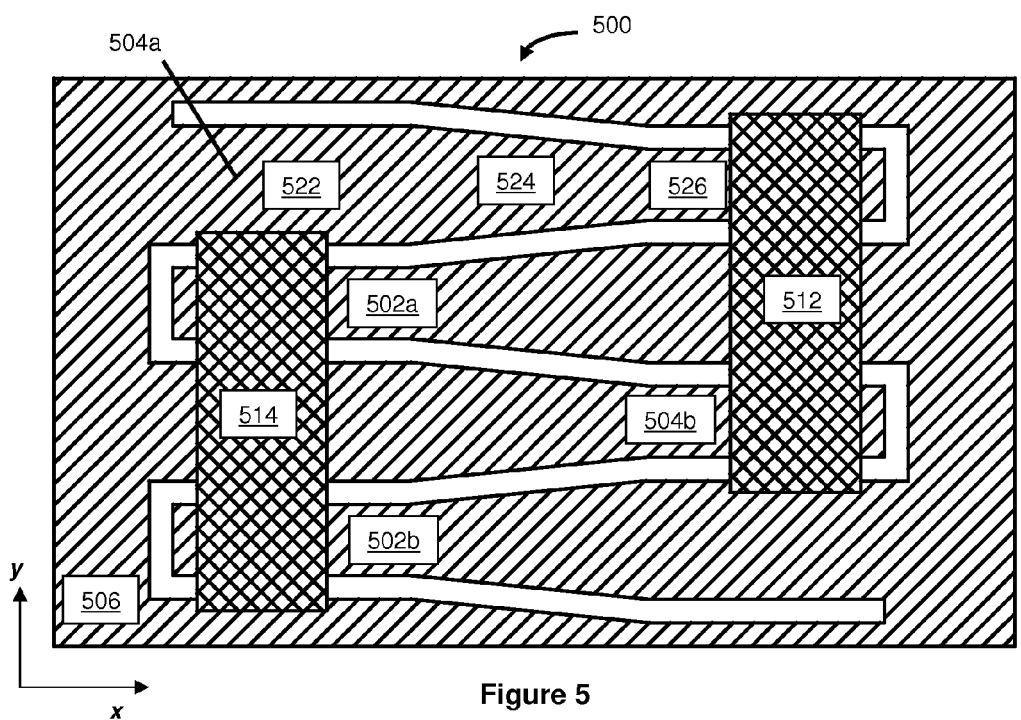
FIG. 5 is a schematic block diagram of another embodiment of a planform-tapered interdigitated beam energy harvester according to the present invention.

FIG. 5 is a schematic block diagram of another embodiment of a planform-tapered interdigitated beam energy harvester according to the present invention. In this embodiment the energy harvester 500 comprises multiple interdigitated planform-tapered piezoelectric bimorph beams wherein each beam (e.g. 504*a* and in addition, beams 502*a*, 502*b*, 504*b*) has an anchored portion 522, a tapered portion 524 and a free end portion 526 (e.g. additionally for attachment of sense mass 512). The beams are anchored to a frame 506 and the end masses 512, 514 are fixed to the free ends of the beams. This embodiment serves to illustrate that it is not necessary to the practice of the invention to have a continuously variable beam width along the entirety of the bimorph beam to enhance the performance (e.g. power density) of the energy harvester 500. Rather, the length and location of the tapered portion 524 of a bimorph beam e.g. 504*a* can be adjusted to suit the requirements of a particular application, e.g. to adjust resonant frequency; conform to the physical configuration of a system, etc.

Figure 6:
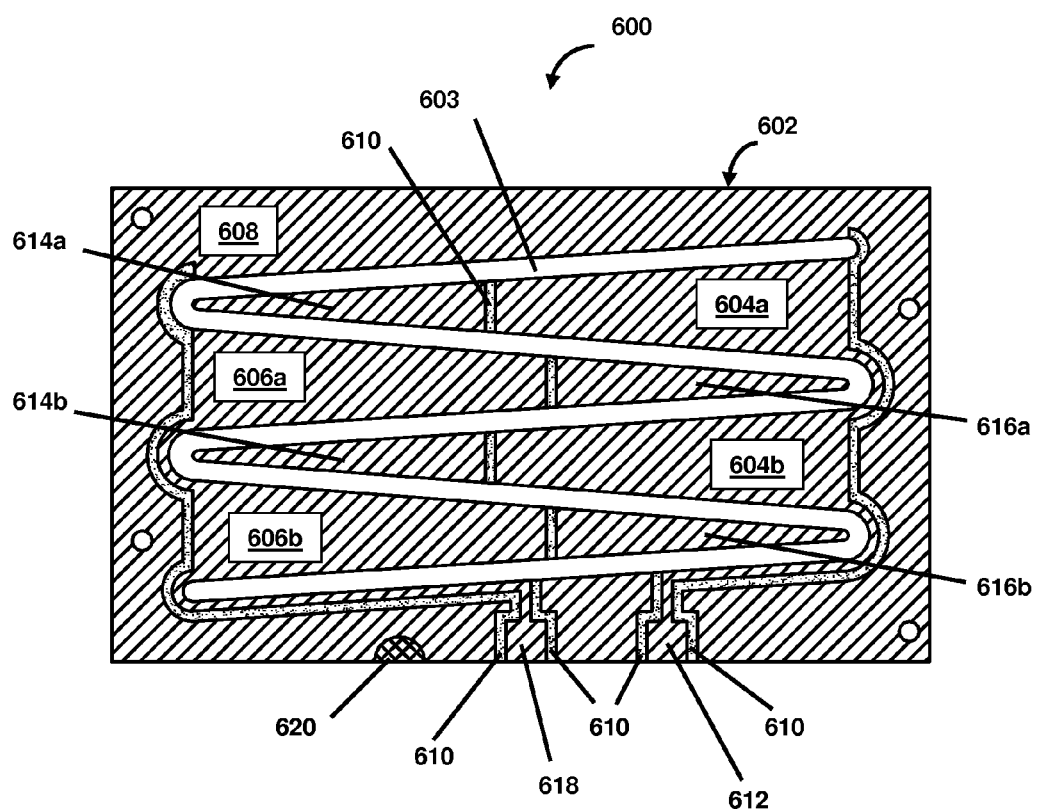
FIG. 6 is a schematic block diagram of a further embodiment of a planform-tapered interdigitated beam energy harvester according to the present invention, with end masses removed for illustration.

FIG. 6 is a schematic block diagram of another embodiment of a planform-tapered interdigitated beam energy harvester according to the present invention, with end masses removed for illustration. The exemplary vibration energy harvester 600 comprises a composite piezoelectric transducer plate 602, consisting of a three-layer PZT/brass/PZT (e.g. with electrodes) stack up as described above, and is machined (e.g. by laser cutting the zigzag slot 603 through the plate 602) to form the interdigitated planform-tapered beams 604(*a,b*) and 606(*a,b*). Support and mounting locations for eventual end masses 614(*a,b*), 616(*a,b*) and an outer frame 608, which serves as a structural anchor for the beams, can also be defined by laser or abrasive water jet machining. The composite plate in this example was commercially purchased and consists of PZT 5A with a 0.2 micron thick nickel layer on each surface. The PZT is bonded to a brass shim material using an electrically conductive epoxy. In this case the PZT elements are poled in a parallel configuration to enable a parallel electrical hook up between the two PZT layers comprising each planform-tapered flexural beam element (see FIG. 1). The composite stack is approximately 407 micron (0.160 inch) thick, including two epoxy bond layers at approximately 13 micron thick each. Note that FIG. 6 illustrates one side of the machined plate 602, the other side being essentially a mirror image.

The areas labeled 610 indicate where the Ni electrode layer has been removed (e.g. as by laser ablation) to isolate electrically conductive regions that form electrical circuits for connection to the piezoelectric elements. The conductive regions connect the flexing-beam areas 604(*a,b*), 606(*a,b*) to the regions forming bond pads (e.g. 612, 618) used for connecting the piezoelectric elements to an external electrical circuit (not shown). This pattern of Ni removal is also replicated on the underside of the composite plate with the brass shim as a plane of symmetry. The beam areas electrically in parallel can be defined as "left" and "right" beam pairs. These beam pairs will be joined through the mass supports via the added end masses, thus forcing the beam elements within a pair to respond to input vibrations in phase. A connection pad 620 is made to the central supporting brass shim by removing (e.g. by laser ablation) the overlaying nickel electrode layer and piezoelectric layer. Contact to pad 620 will form a common for eventual connection to an external circuit.

Figure 7:
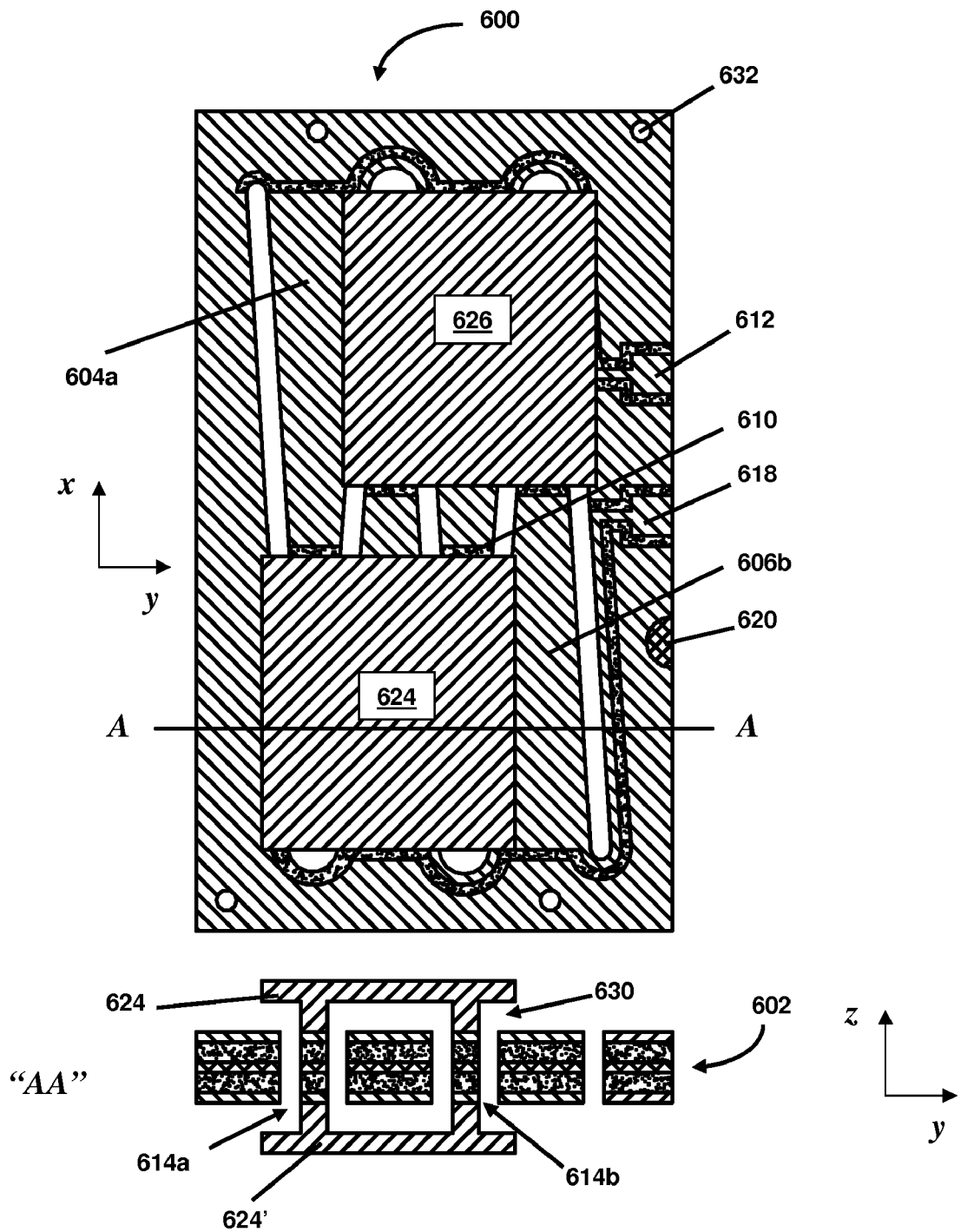
FIG. 7 includes schematic block and cross-sectional diagrams of the embodiment of a planform-tapered interdigitated beam energy harvester of FIG. 6, with end masses in place.

FIG. 7 includes schematic block and cross-sectional diagrams of the embodiment of a planform-tapered interdigitated beam energy harvester of FIG. 6, with end masses in place. FIG. 7 illustrates end masses 624 and 626 affixed (e.g. adhesively bonded) to their respective beam pairs 604(*a,b*) and 606(*a,b*) (partially hidden by the end masses in the plan view). In cross-section "AA", it can be seen that each end mass (e.g. 624 and 624', total of four used in this example) consists of a plate of high density material (e.g. tungsten) with supports machined to match the planform-tapered profile of the beam in the area 614(*a,b*) the mass is attached to the beam. The supports provide the necessary clearance 630 to allow motion of each pair of beams (e.g. 614(*a,b*)) in the z direction without interfering with the motion of the other pair of beams. Although four masses were used in this design, it is conceivable to use only two larger masses each attached to the same side of the composite plate. This can reduce the part count and assembly effort; however, the packaging of the harvester would have to be designed appropriately to accommodate the geometric asymmetry to allow proper beam tip motion. In this example, the sense masses were cut from tungsten preforms by electrical discharge machining. Packaging to complete the energy harvester is essentially a shell comprising two halves encompassing and attached to the plate 602 via mounting holes 632.

Figure 8:
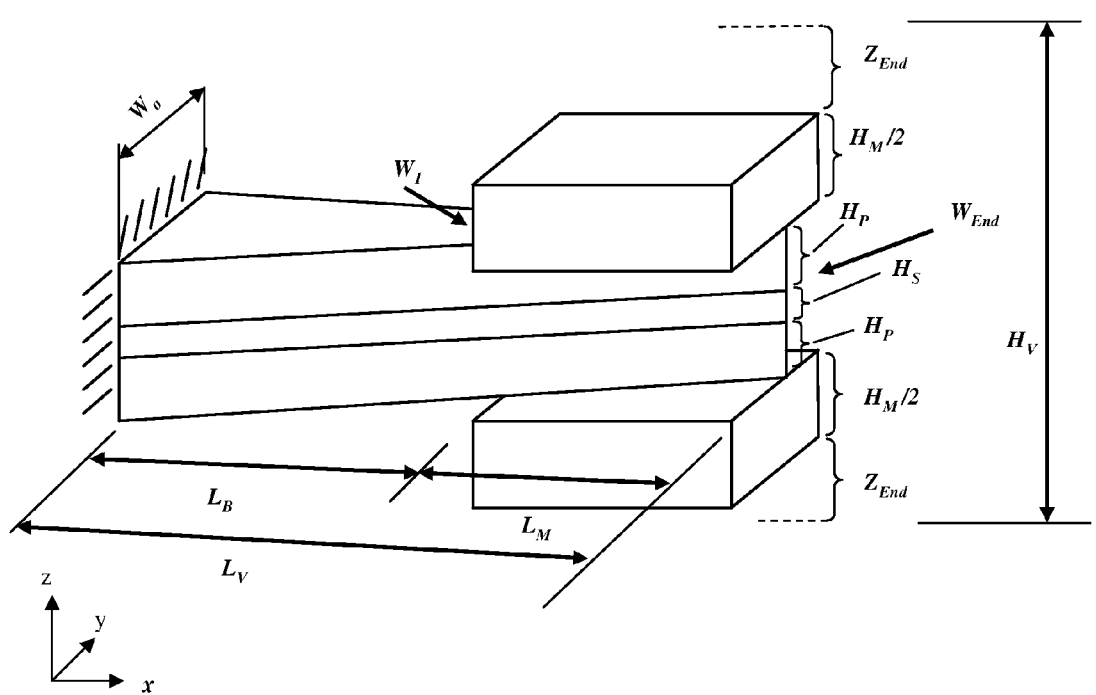
FIG. 8 is a parameterized schematic block diagram of a unit cell of an exemplary embodiment of a planform-tapered interdigitated beam energy harvester according to the present invention.

FIG. 8 is a parameterized schematic block diagram of a unit cell of an exemplary embodiment of a planform-tapered interdigitated beam energy harvester according to the present invention. FIG. 8 illustrates physical parameters of the design with their values listed in Table 1 as used in the exemplary energy harvester as illustrated in FIGS. 6 and 7.

TABLE 1

| Design Parameter | Value (m) |
| --- | --- |
| $L_B$ | 12.5e−3 |
| $L_m$ | 11.5e−3 |
| $H_m$ | 2.51e−3 |
| $W_o$ | 3.67e−3 |
| $H_p$ | 127e−6 |
| $H_s$ | 127e−6 |
| $W_{end}$ | 200e−6 |

FIG. 8 additionally illustrates the unit cell as replicated in the design of the exemplary energy harvester, four unit cells being incorporated in the present example. In modeling the expected performance of the harvester, the beams were assumed to have a maximum deflection of $Z_{end}$ upward and downward, thus producing an overall unit cell volume of $H_v \times L_v \times w_o/2$ The exemplary energy harvester was designed to harvest energy from a vibrational stimulus comprising a 70 Hz resonant frequency. The unit cell design comprised a planform-tapered composite beam 38 micron thick, 3.67 mm wide at its root and 12.5 mm in length. The added end mass was 11.5 mm in length and has a mass of 2.2 grams. The projected power output (into a resistive load of 253 k-ohms, given a 0.2 g sinusoidal base input) for a single composite beam within a unit cell is predicted to be 0.43 mW. With two interdigitated beams fitting within two overlapped 0.5 cc unit cell volumes the power density for the sinusoidal input is predicted to be 1.72 mW/cc. The projected power density for the two composite beams for a random environment with a power spectral density near $10^{(-3)}$ $g^2$/Hz around 70 Hz is 1.14 mW/cc. An open circuit voltage amplitude of 20.9V is predicted for the 140 micron flexing beam tip displacement $Z_o$ (at $x=L_B$).

The above described exemplary embodiments present several variants of the invention but do not limit the scope of the invention. For example, virtually any number of interdigitated beams can be employed and arranged as multiple sets of interconnected (via their end masses) beams to form an energy harvester according to the present invention. Those skilled in the art will appreciate that the present invention can be implemented in other equivalent ways. The actual scope of the invention is intended to be defined in the following claims.

What is claimed is:

1. A piezoelectric energy harvester comprising:
a frame;
a plurality of interdigitated tapered cantilevered beams, the frame and the plurality of interdigitated tapered cantilevered beams exist within a continuous piezoelectric transducer sheet, each beam of the plurality having a fixed end connected to the frame and a moveable end, each beam further comprising:
a supporting layer;
at least one piezoelectric layer affixed to at least one surface of the supporting layer; and
at least a first and a second sense mass, the at least first and second sense masses connected to the moveable ends of at least a first set and a second set of beams respectively of the plurality, wherein the at least first and second sets of beams are operationally configured for motion independent of each other; and
means for electrically contacting the at least one piezoelectric layer of each beam of the plurality.

2. The energy harvester of claim 1 wherein each beam of the plurality comprises a tapered piezoelectric unimorph.

3. The energy harvester of claim 1 wherein each beam of the plurality comprises a tapered piezoelectric bimorph.

4. The energy harvester of claim 1 wherein the support layer comprises one or more selected from an electrically conductive support layer and an electrically non-conductive support layer.

5. The energy harvester of claim 1 wherein at least one beam of the plurality comprises a tapered portion disposed between its fixed end and its moveable end.

6. A piezoelectric vibrational energy harvester comprising:
a plurality of interdigitated tapered cantilevered beams within a continuous piezoelectric bimorph sheet, each beam of the plurality having a fixed end and a movable end, each beam comprising:
a centrally disposed electrically conductive support layer;
a first piezoelectric layer affixed to a first surface of the support layer;
a first electrode contacting the first piezoelectric layer, opposite the support layer;
a second piezoelectric layer affixed to a second surface of the support layer, opposite the first piezoelectric layer; and
a second electrode contacting the second piezoelectric layer, opposite the support layer;
a frame connected to each of the plurality of beams at the fixed end of each beam; and
at least first and second sense masses connected respectively to the movable ends of at least a first set and a second set of beams of the plurality, the at least first and second sense masses and the moveable ends of the at least first and second sets of beams operationally configured to allow for independent motion of each set of beams.

7. The energy harvester of claim 6 wherein the first and second electrodes comprise one or more layers selected from a nickel layer and a silver layer.

8. The energy harvester of claim 6 wherein the first and second piezoelectric layers comprise lead zirconate titanate (PZT).

9. The energy harvester of claim 6 wherein the support layer comprises one or more layers selected from a brass layer and stainless steel layer.

10. The energy harvester of claim 6 wherein each of the beams comprises a beam length, the taper of one or more of the plurality of interdigitated tapered beams extending along the length of the one or more of the plurality from
the fixed end to the moveable end of the one or more of the plurality of beams.

11. The energy harvester of claim 10 wherein each of the one or more of the plurality of tapered beams comprises a form selected from an isosceles triangular form and a right triangular form.

12. The energy harvester of claim 6 wherein a sense mass comprises a tungsten sense mass.

13. The energy harvester of claim 6 further comprising first and second contact pads electrically connected to the first and second electrodes respectively and, a third contact pad electrically connected to the support layer.

14. The energy harvester of claim 6 wherein the at least first and second sense masses are disposed on opposed sides of the piezoelectric bimorph sheet.

15. The energy harvester of claim 6 wherein the at least first and second sense masses are disposed on the same side of the piezoelectric bimorph sheet.

16. A piezoelectric vibrational energy harvester comprising:
- a plurality of interdigitated cantilever beams within a continuous piezoelectric bimorph sheet, each beam of the plurality comprising a stack including:
  - a centrally disposed electrically conductive support layer;
  - a first piezoelectric layer affixed to a first surface of the support layer;
  - a first electrode contacting the first piezoelectric layer, opposite the support layer;
  - a second piezoelectric layer affixed to a second surface of the support layer, opposite the first piezoelectric layer;
  - a second electrode contacting the second piezoelectric layer, opposite the support layer; and
  - a fixed portion proximal to a first end of the beam, a free end portion proximal to an opposed end of the beam and a tapered portion disposed between the fixed portion and the free end portion;
- a frame connected to the fixed portion of each of the plurality of beams; and
- at least first and second sense masses connected respectively to the free end portion of at least a first set of beams and a second set of beams of the plurality, the at least first and second sense masses and the free end portions of the at least first and second sets of beams operationally configured to allow for independent motion of each set of beams.

17. The energy harvester of claim 16 wherein the first and second electrodes comprise one or more layers selected from a nickel layer and a silver layer.

18. The energy harvester of claim 16 wherein the first and second piezoelectric layers comprise lead zirconate titanate (PZT).

19. The energy harvester of claim 16 wherein the support layer comprises one or more layers selected from a brass layer and stainless steel layer.

20. The energy harvester of claim 16 wherein a sense mass comprises a tungsten sense mass.

21. The energy harvester of claim 16 further comprising first and second contact pads electrically connected to the first and second electrodes respectively and, a third contact pad electrically connected to the support layer.

22. The energy harvester of claim 16 wherein the at least first and second sense masses are disposed on opposed sides of the piezoelectric bimorph sheet.

23. The energy harvester of claim 16 wherein the at least first and second sense masses are disposed on the same side of the piezoelectric bimorph sheet.

* * * * *